United States Patent [19]

Nagano

[11] Patent Number: 4,570,089
[45] Date of Patent: Feb. 11, 1986

[54] PULSE FREQUENCY MULTIPLIER

[75] Inventor: Katsumi Nagano, Shimonoseki, Japan

[73] Assignee: Tokyo Shibaura Denki Kabushiki Kaisha, Japan

[21] Appl. No.: 497,138

[22] Filed: May 23, 1983

[30] Foreign Application Priority Data

May 27, 1982 [JP] Japan .................................. 57-90063

[51] Int. Cl.[4] ............................................ H03B 19/00
[52] U.S. Cl. .................................. 307/529; 307/361;
328/15; 328/115; 328/127; 377/47
[58] Field of Search ................. 377/47; 307/361, 529;
328/115, 127, 15

[56] References Cited

U.S. PATENT DOCUMENTS

| 3,262,069 | 7/1966 | Stella | 377/47 |
|---|---|---|---|
| 3,743,946 | 7/1973 | Gass et al. | 328/110 |
| 3,796,960 | 3/1974 | Frizzell et al. | 328/20 |
| 4,052,626 | 10/1977 | Tuma et al. | 307/271 |
| 4,063,070 | 12/1977 | Delarue et al. | 235/474 |
| 4,092,550 | 5/1978 | Lauffer | 307/229 |
| 4,353,030 | 10/1982 | Nakamura et al. | 328/38 |

FOREIGN PATENT DOCUMENTS

| 2105874 | 8/1972 | Fed. Rep. of Germany . |
|---|---|---|
| 2105873 | 8/1972 | Fed. Rep. of Germany . |
| 3033867 | 4/1981 | Fed. Rep. of Germany . |
| 56-45459 | 10/1981 | Japan . |

OTHER PUBLICATIONS

Patents Abstracts of Japan, vol. 4, No. 98, Jun. 21, 1980, p. 100E16.

Primary Examiner—John S. Heyman
Attorney, Agent, or Firm—Finnegan, Henderson, Farabow, Garrett & Dunner

[57] ABSTRACT

An input pulse signal is frequency-divided by a flip-flop. The frequency-divided signal from the flip-flop is used to control charging and discharging of a capacitor so as to generate a triangular wave voltage which has the same period as that of the frequency-divided signal. The triangular wave voltage is supplied to a multiwindow comparator which has a plurality of inverting voltages so as to generate a plurality of pulse signals within one period of the triangular wave voltage.

11 Claims, 6 Drawing Figures

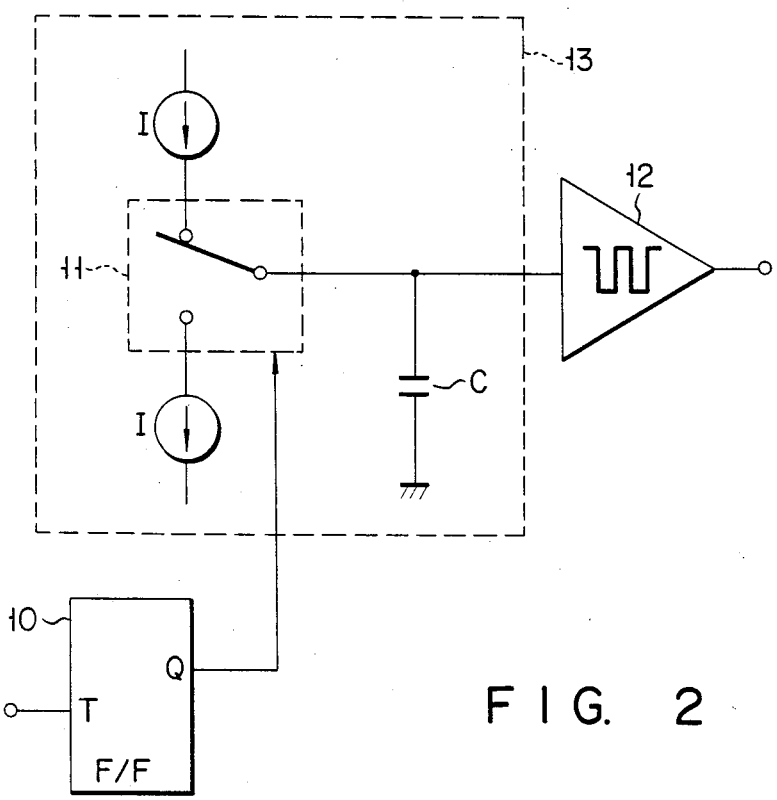
F I G. 2

PULSE FREQUENCY MULTIPLIER

BACKGROUND OF THE INVENTION

The present invention relates to a pulse frequency multiplier for multiplying an input pulse frequency using bipolar transistors.

Conventionally, various types of frequency multipliers which use bipolar transistors are known. For example, a simple circuit which is readily arranged as an integrated circuit is disclosed in Japanese Patent Publication (Kokoku) No. 56-45459 issued to E. Taira and assigned to Matsushita Denki Sangyo. As shown in FIG. 1, a triangular wave voltage B is generated by a constant current source 1 and a capacitor 2. The voltage B is pulsated by a voltage level switch 3. The pulse signal from the voltage level switch 3 is frequency-divided by a flip-flop 4 which then produces pulse signals A and $\overline{A}$. A current control switch 5 is controlled in accordance with the pulse signal A, thereby controlling a period of the voltage B. The voltage B is also supplied to a differential amplifier 6 which then produces triangular wave signals B and $\overline{B}$ of opposite phases. The signals B and $\overline{B}$ are both supplied to differential amplifiers 7 and 8. The signal A is supplied to the differential amplifier 8 and the signal $\overline{A}$ is supplied to the differential amplifier 7. Output pulses C7 and C8 from the differential amplifiers 7 and 8 respectively are coupled to a buffer transistor 9, and a composite voltage is obtained.

However, in the frequency multiplier of the type described above, the triangular wave voltage is simply generated and multiplied. No method is described which receives and multiplies an arbitrary pulse signal. Furthermore, since the triangular wave voltage is generated by an open loop, a triangular wave voltage which is proportional to the magnitude of the input pulse cannot be produced, resulting in inconvenience. In other words, it is impossible to multiply the frequency of an input pulse.

SUMMARY OF THE INVENTION

It is, therefore, an object of the present invention to provide a pulse frequency multiplier for generating an output pulse which is obtained by multiplying a frequency of an input pulse having any duty ratio.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the pulse frequency multiplier of this invention, comprises a first power source line to which a first power source voltage is supplied; a second power source line to which a second power source voltage is supplied; a flip-flop circuit for receiving and frequency-dividing an input pulse signal to output a frequency-divided pulse signal; a current direction changeover switch controlled by the frequency-divided pulse signal from said flip-flop circuit; a current source circuit, in which the direction of output current is controlled by said current direction changeover switch; a triangular wave generating capacitor connected between an output end of said current source circuit and said second power source line so as to generate a triangular wave voltage in response to being charged and discharged, said triangular wave voltage having the same period as the frequency-divided pulse signal; a circuit connected to receive an output from said differentiator for differentiating the frequency-divided pulse signal from said flip-flop circuit; and initial-value-setting differentiator so as to set the triangular wave voltage across said triangular wave generating capacitor at an initial value; a reference voltage generator for generating a reference voltage which sets a peak value for the triangular wave voltage; a voltage comparator for comparing the reference voltage from said reference voltage generator with the triangular wave voltage to obtain a comparison output signal; a voltage control circuit for receiving the comparison output signal from said voltage comparator; a control voltage generating capacitor, the terminal voltage of which is controlled by said voltage control circuit; a voltage-to-current converter for converting the voltage from said control voltage generating capacitor to a current corresponding to the terminal voltage and thereby the level of output current of said current source circuit; and a multiwindow comparator connected to receive the triangular wave voltage from said triangular wave generating capacitor and for generating a plurality of pulse signals during one period of the triangular wave voltage.

According to the pulse frequency multiplier having a circuit arrangement described above, a triangular wave voltage associated with an input pulse signal can be generated, and the triangular wave voltage can be converted to a plurality of pulses. Therefore, multiplication can be performed for any input pulse signal. Furthermore, since the triangular wave voltage is controlled by the frequency-divided pulse which is obtained by frequency-dividing the input pulse signal, multiplication can be performed for an input pulse signal having any duty ratio.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIG. 2 is a block diagram showing the basic arrangement of a pulse frequency multiplier constructed according to the present invention;

DETAILED DESCRIPTION OF THE PREFERRED EMBODIMENTS

Figure 1:
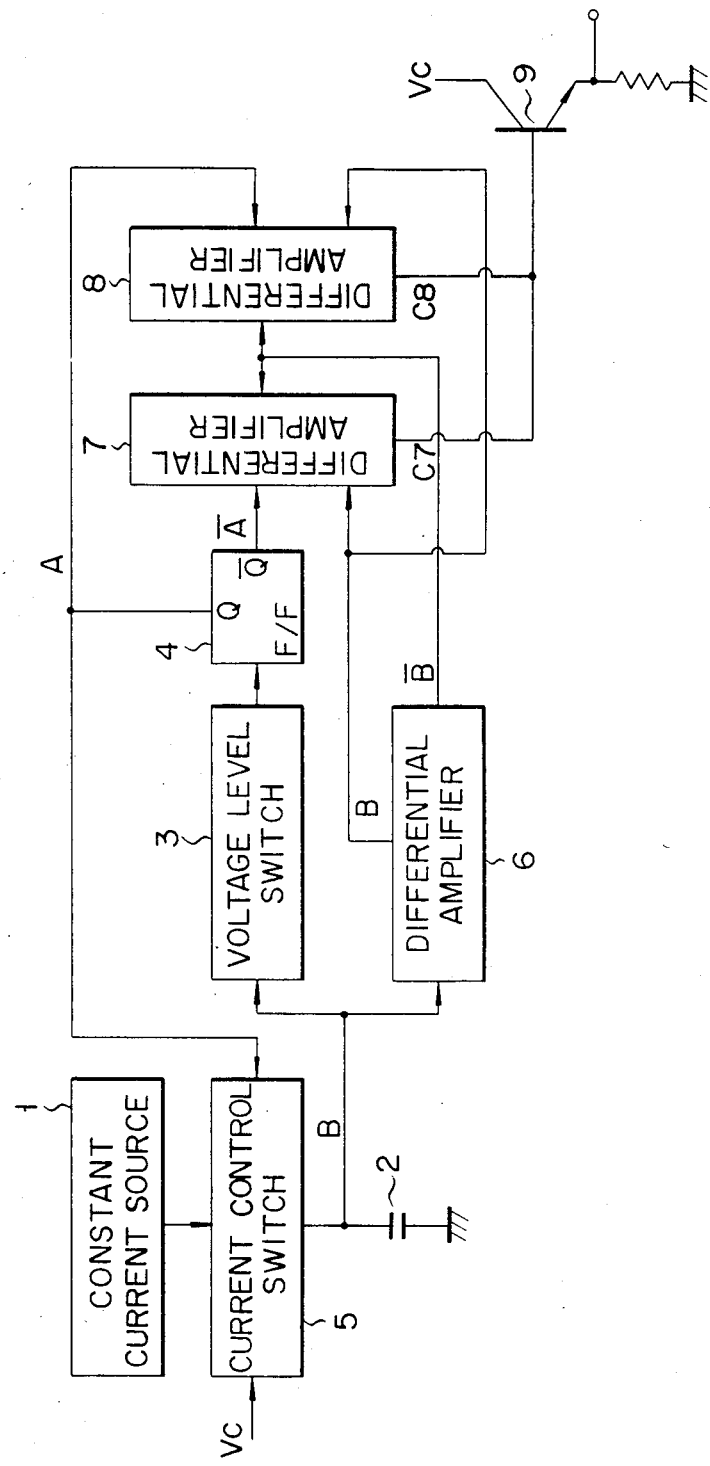
FIG. 1 is a block diagram showing a conventional frequency multiplier.

FIG. 2 shows the basic arrangement of a pulse frequency multiplier according to the present invention. The frequency of an input pulse signal is halved by a flip-flop 10. The frequency-divided pulse from the flip-flop 10 controls a current direction changeover switch 11, thereby controlling charging and discharging of a capacitor C. A triangular wave voltage which has a period twice that of the input pulse signal (i.e., the same period as that of the frequency-divided pulse signal) is generated in accordance with charging/discharging of the capacitor C. When the triangular wave voltage is supplied to a multiwindow comparator 12 which has four inverting or threshold voltages, the multiwindow comparator 12 produces a multiplied pulse signal. Reference numeral 13 denotes a triangular wave generator.

Figure 3:
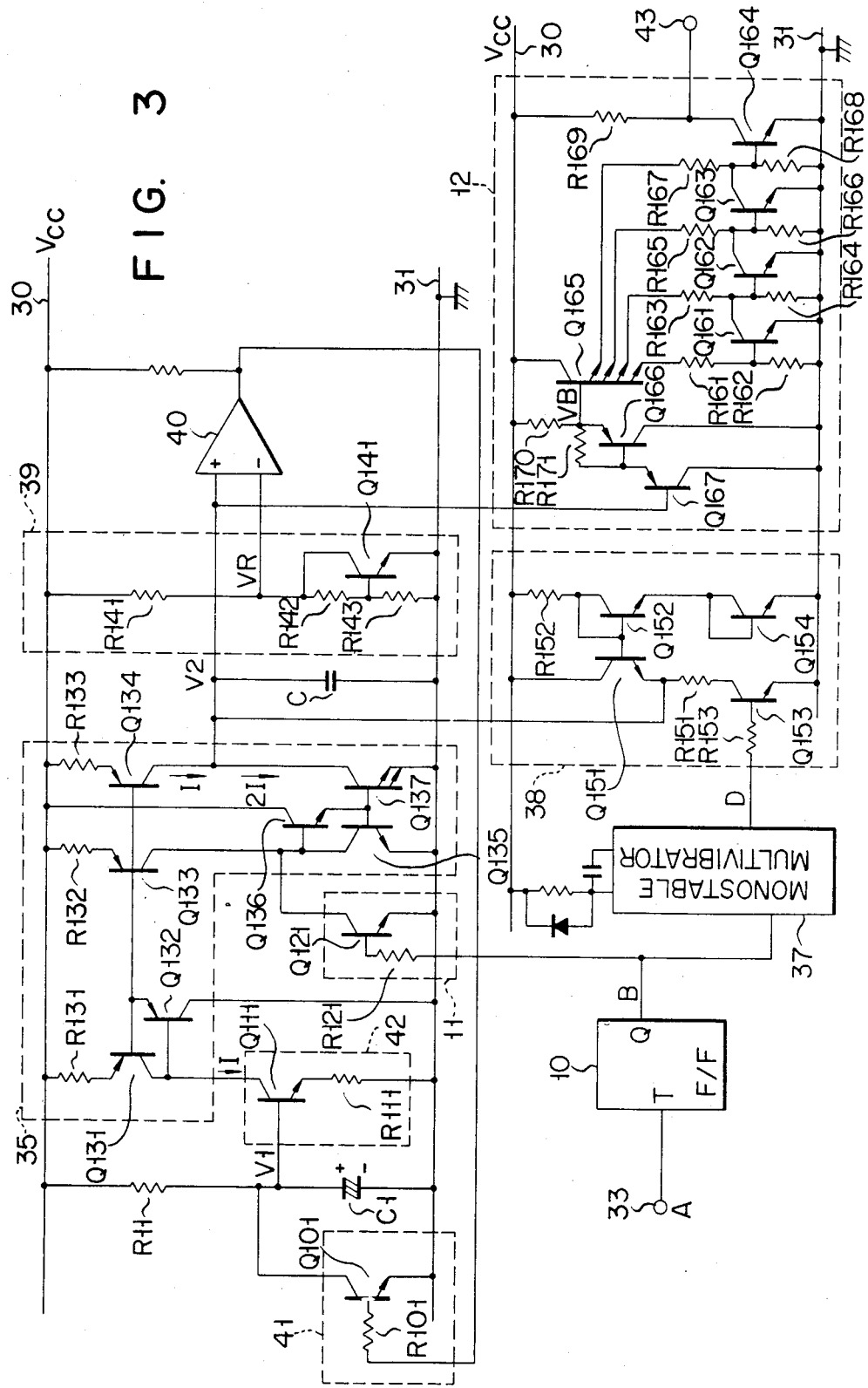
FIG. 3 is a circuit diagram of a pulse frequency multiplier constructed according to an embodiment of the present invention.

FIG. 3 shows a pulse frequency multiplier according to an embodiment of the present invention. The overall arrangement will be described first. Reference numeral 30 denotes a first power source line to which a positive power source voltage $V_{CC}$ is supplied; 31, a second power source line which is grounded; 10, a flip-flop for producing a frequency-divided pulse signal B which is obtained by frequency-dividing an input pulse signal A supplied from a pulse signal input terminal 33; 11, a current direction changeover switch which comprises a resistor R121 and a transistor Q121 and is switched by the output pulse signal B from the flip-flop 10; 35, a current source circuit controlled by the switch 11 such that the direction of current from the current source circuit 35 is reversed; C, a triangular wave generating capacitor connected between the output end of the current source circuit 35 and the ground line or the second power source line 31 so as to generate a triangular wave voltage V2 upon charging and discharging; and 12, a multiwindow comparator which receives the triangular wave voltage V2 from the capacitor C.

Reference numeral 37 denotes a monostable multivibrator which receives the output pulse signal B from the flip-flop 10 to generate a differentiation pulse signal D of 0.1 μs pulse width at the leading edge of the output pulse signal B. Reference numeral 38 denotes an initial value setting circuit which receives the differentiation pulse signal D. When the differentiation pulse signal D is kept high, the initial value setting circuit 38 is kept ON so as to set as an initial value (a base-emitter voltage $V_{BE}$ of an npn transistor) a voltage across the two ends of the capacitor C. Reference numeral 39 denotes a reference voltage generator for generating a reference voltage VR (e.g., $9V_{BE}$) which sets a peak value of the triangular wave voltage V2.

Reference numeral 40 denotes a voltage comparator for comparing the reference voltage VR and the triangular wave voltage V2. If V2≧VR, the voltage comparator 40 produces an output signal of high level. Reference numeral 41 denotes a voltage control circuit which receives an output signal from the voltage comparator 40 so as to lower a control voltage V1 of a control voltage generating capacitor C1. The voltage control circuit 41 comprises a resistor R101 and a transistor Q101 which later is kept ON when the output signal from the voltage comparator 40 is kept high. The capacitor C1 is charged from the first power source line 30 through a resistor R11. The control voltage V1 appearing across two ends of the capacitor C1 falls within a range between 0 V and $V_{CC}$. Reference numeral 42 denotes a voltage/current converter which comprises a transistor Q111 which receives the control voltage V1 and a resistor R111 which is connected to the emitter of the transistor Q111. The voltage/current converter 42 converts the control voltage V1 to a current I corresponding thereto. An output current I from the current source circuit 35 is determined in accordance with the output current I from the voltage/current converter 42.

The detailed arrangement and the mode of operation of the component parts described above will be described hereinafter. In the current source circuit 35, the emitters of transistors Q131, Q133 and Q134 are commonly connected to the first power source line 30 through resistors R131, R132 and R133, respectively. The bases of the transistors Q131, Q133 and Q134 are commonly connected to each other and to the emitter of a transistor Q132. The collector of the transistor Q132 is grounded, and the base thereof is connected together with the collector of the transistor Q131 to the output end of the voltage/current converter 42. The collector of a transistor Q135 and the base of a transistor Q136 are connected to the collector of the transistor Q133. The collector of the transistor Q134 is connected to the collector of a multiemitter transistor Q137 having two emitters. The base of the transistor Q137 is connected to the base of the transistor Q135 and to the emitter of the transistor Q136. The collector of the transistor Q135 is connected to the output end of the changeover switch 11.

When the changeover switch 11 is opened, the current I flows in the transistors Q131, Q133, Q134 and Q135. A current 2I flows in the transistor Q137. As a result, the current I flows from the capacitor C to the transistor Q137. On the other hand, when the changeover switch 11 is closed, no current flows to the base of the transistor 137, which is then turned off. The current I from the transistor Q134 flows in the capacitor C, which is then charged.

In the initial value setting circuit 38, a level shift circuit comprises transistors Q151 and Q152. The transistor Q151 is grounded through a series circuit of a resistor R151 and a transistor Q153. The transistor Q152 is connected to the first power source line 30 through a resistor R152. The emitter of the transistor Q152 is grounded through a transistor Q154 whose base and collector are connected to each other. The base of the transistor Q153 is connected to the output end of the monostable multivibrator 37 through a resistor R153. The emitter of the transistor Q151 is connected to the capacitor C.

When the positive differentiation pulse signal D is supplied from the monostable multivibrator 37 to the initial value setting circuit 38, the transistor Q153 is turned on, and the voltage across the capacitor C is kept at the initial value (the base-emitter voltage $V_{BE}$ of the transistor Q151). The transistor Q153 is kept OFF during any other time interval.

In the reference voltage generator 39, a series circuit of resistors R141, R142 and R143 is connected between the first and second power source lines 30 and 31. The collector and base of a transistor Q141 are respectively connected to the two ends of the resistor R142. The emitter of the transistor Q141 is grounded. The ratio of the resistance of the resistor R142 to that of the resistor R143 is 8:1. Therefore, the collector voltage of the transistor Q141 is 9 (=1+8) times the base-emitter voltage thereof (i.e., $V_{BE}$).

In the multiwindow comparator 12, a multiemitter transistor Q165 has four emitters. The collector of the transistor Q165 is connected to the power source line 30. The first emitter of the transistor Q165 is grounded through a voltage divider of resistors R161 and R162, the second emitter thereof is grounded through a series circuit of resistors R163 and R164, the third emitter thereof is grounded through resistors R165 and R166, and the fourth emitter thereof is grounded through resistors R167 and R168. A node (voltage division point) between the resistors R161 and R162 is connected to the base of a transistor Q161. A node between the resistors R163 and R164 is connected to the collector of transistor Q161 and to the base of a transistor Q162. A node between the resistors R165 and R166 is connected to the collector of a transistor Q162 and to the base of a transistor Q163. A node between the resistors R167 and R168 is connected to the collector of the transistor Q163 and to the base of a transistor Q164. The collector of the transistor Q164 is connected to a pulse signal output terminal 43 and to the power source line 30 through a resistor R169. The emitters of the transistors Q161 to Q164 are commonly grounded. The base of the transistor Q165 is connected to the power source line 30 through a resistor R170, and is also connected to the emitter of a transistor Q166. The collector of the transistor Q166 is grounded, and the base thereof is connected to the emitter thereof through a resistor R171. Furthermore, the base of the transistor Q166 is connected to the emitter of a transistor Q167. The collector of the transistor Q167 is grounded, and the base thereof receives the triangular wave voltage V2 from the capacitor C.

The ratio of the resistance of the resistor R167 to that of the resistor R168 is 2:1; the ratio of the resistance of the resistor R165 to that of the resistor R166 is 4:1; the ratio of the resistance of the resistor R163 to that of the resistor R164 is 6:1; and the ratio of resistance of the resistor R161 to that of the resistor R162 is 8:1. Therefore, when a base voltage $V_B$ of the multi-emitter transistor Q165 is $4V_{BE}$ or lower, the transistors Q161 to Q164 are kept OFF and an output voltage at the pulse signal output terminal 43 is kept high. When the base voltage $V_B$ falls within the range of $4V_{BE} < V_B \leq 6V_{BE}$, only the transistor Q164 goes high and output voltage from the output terminal 43 then goes to low level. When the base voltage $V_B$ falls within a range of $6V_{BE} < V_B \leq 8V_{BE}$, the transistor Q163 is turned on, so that the transistor Q164 is turned off. Thus, the output voltage from the output terminal 43 goes to high level. When the base voltage $V_B$ falls within a range of $8V_{BE} < V_B \leq 10V_{BE}$, the transistor Q162 is turned on, so that the transistor Q163 is turned off, but the transistor Q164 is turned on. Then, the output voltage from the output terminal 43 goes to low level. When the base voltage $V_B$ satisfies $10V_{BE} < V_B$, the transistor Q161 is turned on, so that the transistor Q162 is turned off. The transistor Q163 is then turned on, so that the transistor Q164 is turned off. The output voltage from the output terminal 43 goes to high level. The output voltage from the output terminal 43 is inverted every time the base voltage $V_B$ from the multi-emitter transistor Q165 exceeds $4V_{BE}$, $6V_{BE}$, $8V_{BE}$, and $10V_{BE}$, respectively. Therefore, the output voltage of the multiwindow comparator 12 is inverted every time its input end receives a voltage exceeding voltages (i.e., $2V_{BE}$, $4V_{BE}$, $6V_{BE}$ and $8V_{BE}$) which are lower than the voltage $V_B$ by $2V_{BE}$, that is, the base-emitter voltage of the transistors Q166 and Q167. Therefore, the multiwindow comparator 12 has four threshold voltages.

Figure 4:
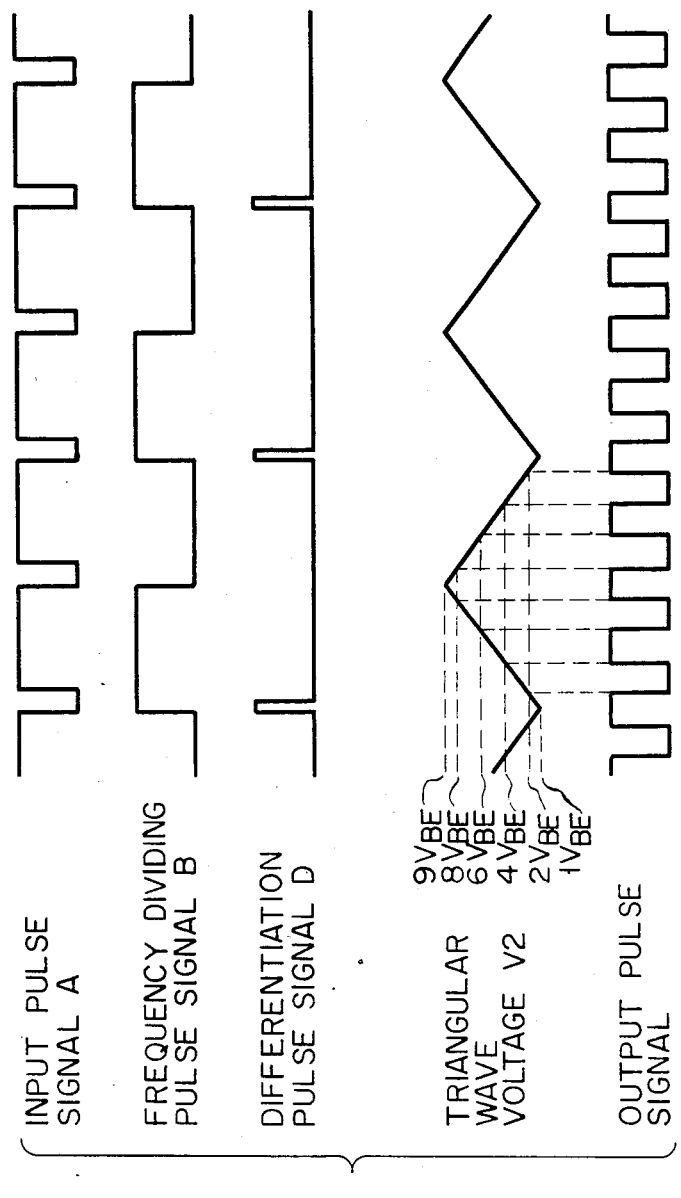
FIG. 4 is a timing chart for explaining the mode of operation of the pulse frequency multiplier shown in FIG. 3.

The mode of operation of the circuit shown in FIG. 3 will be described with reference to the timing chart shown in FIG. 4. When the input pulse signal A is supplied to the pulse signal input terminal 33, the frequency of the input pulse signal A is halved by the flip-flop 10.

A frequency-divided signal B from the flip-flop 10 is supplied to the monostable multivibrator 37 which then produces a differentiation pulse signal D. This signal D is then supplied to the initial value setting circuit 38. The voltage V2 across the capacitor C is set to be $V_{BE}$ ($\approx 0.7$ V). When the pulse signal B is kept high, a current I flows from the current source circuit 35 to the capacitor C under the control of the changeover switch 11. Therefore, the voltage V2 across the capacitor C linearly increases. However, when the pulse signal B goes low, the current I flows from the capacitor C to the current source circuit 35. The voltage V2 across the capacitor C then linearly decreases. Therefore, the triangular wave voltage V2 is generated from the capacitor C to have the same period as that of the pulse signal B (i.e., a period twice that of the period of the input pulse signal A).

In the steady state, the peak value of the triangular wave voltage V2 is feedback-controlled to be a reference voltage $9V_{BE}$ ($\approx 6.3$ V) generated by the reference voltage generator 39. When the triangular wave voltage V2 exceeds the reference voltage VR, the voltage comparator 40 produces an output signal of high level, thereby turning on the transistor Q101 of the voltage control circuit 41. When the transistor Q101 is turned on, the voltage V1 across the capacitor C1 decreases, and the output current I from the voltage/current converter 42 decreases. The discharging current of the capacitor C then decreases, thereby decreasing the peak value of the capacitor C. Since the output signal from the voltage comparator 40 is kept low until the steady state is obtained, the voltage control circuit 41 is kept OFF. The voltage V1 across the capacitor C1 gradually increases since a charging current flows through the resistor R11. The output current I from the voltage/current converter 42 gradually increases. The output current I is determined by equation (1):

$$I = (V1 - V_{BE})/R111 \tag{1}$$

The output voltage from the multiwindow comparator 12 is inverted at inverting or threshold voltages of $2V_{BE}$, $4V_{BE}$, $6V_{BE}$ and $8V_{BE}$ when the input triangular input voltage V2 is changed in a cycle of $1V_{BE}$ (initial value), $9V_{BE}$ (peak value) and $1V_{BE}$. Therefore, pulse signals of four periods can be generated while the triangular wave signal of one period is supplied. The triangular wave signal has a frequency half of that of the input pulse signal A, so that the frequency of the pulse signal output from the multiwindow comparator 12 is doubled with respect to the input pulse signal A. In this case, since the threshold voltages of the multiwindow comparator 12 are set to be $1V_{BE}$, $4V_{BE}$, $6V_{BE}$ and $8V_{BE}$ within the amplitude ($1V_{BE}$ to $9V_{BE}$) of the triangular wave signal in units of $V_{BE}$ (i.e., ⅛, ⅜, ⅝ and ⅞), and the threshold voltages have equal separation intervals of $2V_{BE}$, the duty ratio of the pulse output is 50%, thereby obtaining uniform output pulse signals.

In the multiplier described above, since the input pulse signal A is frequency-divided by the flip-flop 10 to obtain the frequency-divided pulse signal B which is then used to control the switching of the changeover switch 11, the duty ratio of the input pulse signal A need not be predetermined. For example, even if an input pulse signal has a small duty ratio and a small pulse width, this pulse can be multiplied. Furthermore, the pulse signal B is used to perform initial setting of the triangular wave voltage V2 so as to achieve proper synchronization, thereby performing proper multiplication.

Figure 5:
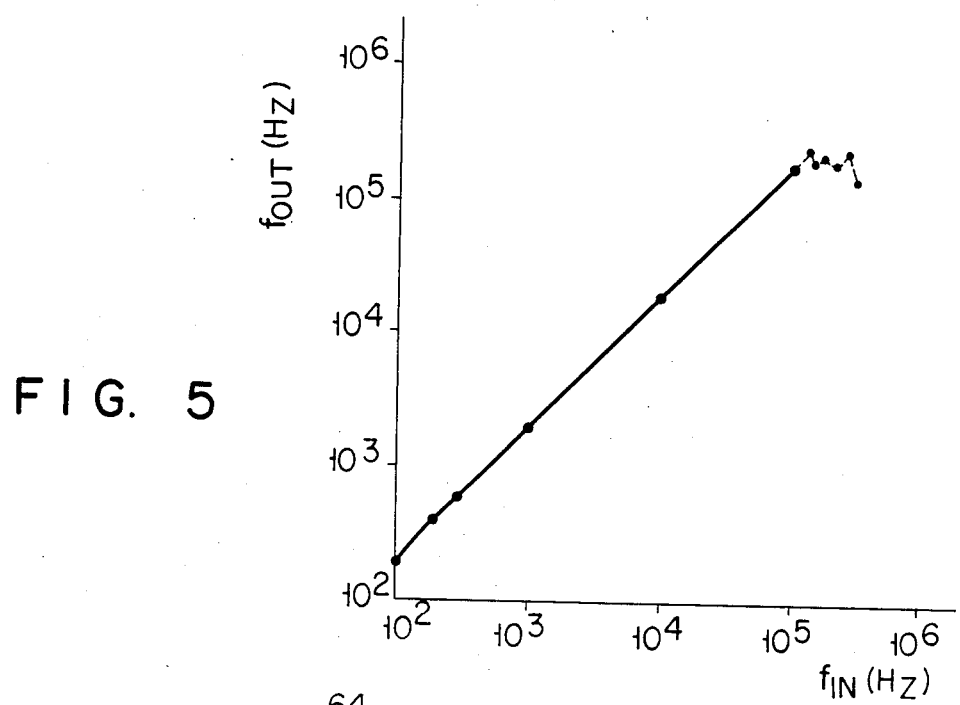
FIG. 5 is a graph showing the experimental results for the input frequency vs output frequency characteristics of the multiplier shown in FIG. 3.

A breadboard test was carried out for the circuit shown in FIG. 3. The output current I from the voltage/current converter 42 was changed to 1 µA, 10 µA, 100 µA and 1 mA, respectively, and the frequency of the input pulse signal A was changed in a wide frequency range (1,000 times) of 100 Hz, 1 kHz, 10 kHz, and 100 kHz. According to the breadboard test, it was found that multiplication of the pulse signal could be stably performed. The test results are shown in FIG. 5 in which the characteristics for an input signal frequency $f_{IN}$ vs an output signal frequency $f_{OUT}$ are shown. Period T of the input pulse signal A is given as follows:

$$T=(C \cdot V)/I \qquad (2)$$

where C is the capacitance of the capacitor C, I is the charging/discharging current thereof, and V is the peak value ($=8V_{BE}$) across the capacitor C.

Therefore, if the voltage V across the capacitor C is about 6.3 V, and the capacitance of the capacitor C is 0.002 µF, the input frequency $f_{IN}$ of the input pulse signal supplied to the multiplier falls within the following range:

$$89 \text{ Hz} < f_{IN} < 89 \text{ kHz}$$

The above range coincides with the test results shown in FIG. 5. Therefore, the multiplier of this type can be used as a low-frequency multiplier when the capacitance of the capacitor C is increased. However, this multiplier can also be used as a high-frequency multiplier when the capacitance of the capacitor C is decreased.

Figure 6:
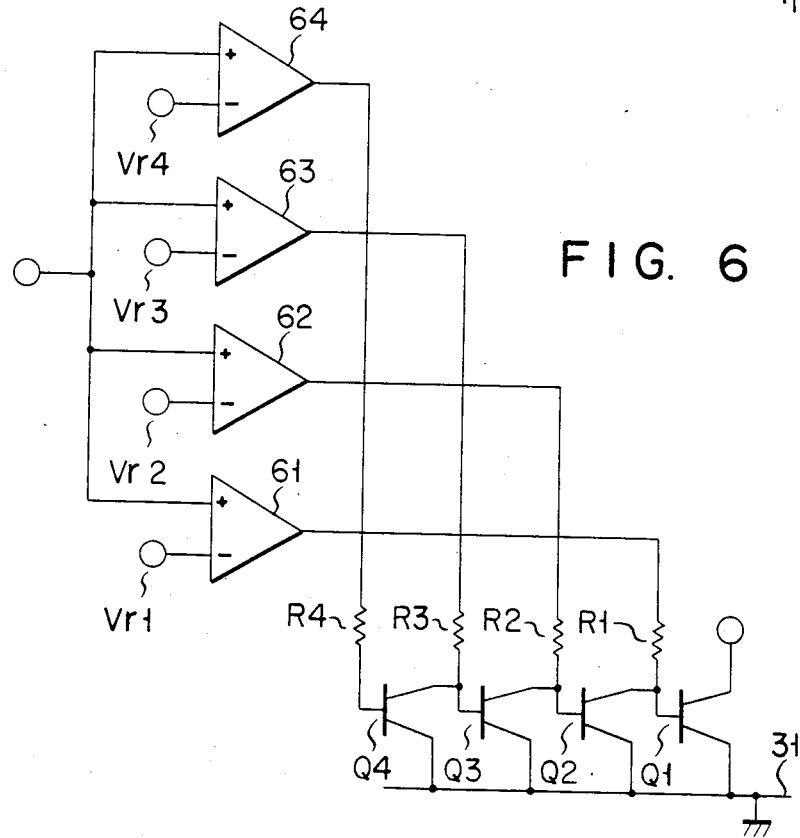
FIG. 6 is a circuit diagram showing a modification of a multiwindow comparator shown in FIG. 2.

FIG. 6 shows a modification of a multiwindow comparator. A common input voltage Vin is supplied to voltage comparators 61, 62, 63 and 64 which respectively have reference voltages Vr1, Vr2, Vr3 and Vr4, where Vr1<Vr2<Vr3<Vr4. Outputs from the voltage comparators 61, 62, 63 and 64 are supplied to the bases of transistors Q1, Q2, Q3 and Q4 through resistors R1, R2, R3 and R4, respectively. The emitters of the transistors Q1, Q2, Q3 and Q4 are commonly grounded. The collector of the transistor Q4 is connected to the base of the transistor Q3. The collector of the transistor Q3 is connected to the base of the transistor Q2. The collector of the transistor Q2 is, in turn, connected to the base of the transistor Q1. An output pulse signal from the multiwindow comparator is produced from the collector of the transistor Q1. Even in a circuit having a plurality of voltage comparators and logic circuits, the same effect can be obtained in the same manner so as to have four inverting voltages Vr1, Vr2, Vr3 and Vr4 as in the case of the above-mentioned multiwindow comparator.

What is claimed is:
1. A pulse frequency multiplier, comprising:
a first power source line to which a first power source voltage is supplied;
a second power source line to which a second power source voltage is supplied;
a flip-flop circuit for receiving and frequency-dividing an input pulse signal to output a frequency-divided pulse signal;
a current direction changeover switch controlled by the frequency-divided pulse signal from said flip-flop circuit;
a current source circuit, in which the direction of output current is controlled by said current direction changeover switch;
a triangular wave generating capacitor connected between an output end of said current circuit and said second power source line so as to generate a triangular wave voltage in response to being charged and discharged, said triangular wave voltage having the same period as the frequency-divided pulse signal;
a differentiator for differentiating the frequency-divided pulse signal from said flip-flop circuit;
an initial-value-setting circuit connected to receive an output from said differentiator so as to set the triangular wave voltage across said triangular wave generating capacitor at an initial value;
a reference voltage generator for generating a reference voltage which sets a peak value for the triangular wave voltage;
a voltage comparator for comparing the reference voltage from said reference voltage generator with the triangular wave voltage to obtain a comparison output signal;
a voltage control circuit for receiving the comparison output signal from said voltage comparator;
a control voltage generating capacitor, the terminal voltage of which is controlled by said voltage control circuit;
a voltage-to-current converter for converting the voltage from said control voltage generating capacitor to a current corresponding to the terminal voltage and thereby the level of output current of said current source circuit; and
a multiwindow comparator connected to receive the triangular wave voltage from said triangular wave generating capacitor and for generating a plurality of pulse signals during one period of the triangular wave voltage.
2. A multiplier according to claim 1, wherein said current direction changeover switch comprises a transistor, a collector and emitter of which are connected between said current source circuit and a second power source line, and a resistor connected to a base of said transistor and an output end of said flip-flop.
3. A multiplier according to claim 1, wherein said current source circuit comprises:
a first transistor, having an emitter connected to said first power source line through a first resistor, and a collector connected to said voltage-to-current converter;
a second transistor, having an emitter-base path connected to the base-collector path of said first transistor, and a collector connected to said second power source line;
a third transistor, having a base connected to the base of said first transistor, an emitter connected to said first power source line through a second resistor, and a collector connected to said current direction changeover switch and to said second power source line through a collector-emitter path of a fourth transistor;
a fifth transistor, having a base connected to the base of said first transistor, an emitter connected to said first power source line through a third resistor, and a collector connected to one side of said triangular wave generating capacitor and also to said second power source line through a colllector-emitter path of a sixth transistor; and a seventh transistor, having a base connected to a node between the collectors of said third and fourth transistors, a collector connected to said first power source line, and an emitter connected to the bases of said fourth and sixth transistors.

4. A mulitplier according to claim 1, wherein said differentiator comprises a monostable multivibrator.

5. A multiplier according to claim 1, wherein said initial-value-setting circuit comprises:

an eighth transistor, having a collector connected to a first power source line, and an emitter connected to said one side of said triangular wave generating capacitor and also to a second power source line through a fourth resistor and a collector-emitter path of a ninth transistor;

a fifth resistor, connected between the base of said ninth transistor and the output of said differentiator;

a tenth transistor, having a base connected to the base of said eighth transistor, and a collector connected to its base and to said first power source line through a sixth resistor; and an eleventh transistor, having a collector-emitter path connected between the emitter of said tenth transistor and said second power source line, and a base connected to its collector.

6. A multiplier according to claim 1, wherein said reference voltage generator comprises seventh, eighth and ninth resistors connected in series between said first power source line and said second power source line; and a transistor, having a collector connected to a node between said seventh and eighth resistors, an emitter connected to said second power source line, and a base connected to a node between said eighth and ninth resistors, a voltage appearing at the node of said seventh and eighth resistors being supplied as the reference voltage to said voltage comparator.

7. A multiplier according to claim 1, wherein said voltage control circuit comprises a transistor, a collector and an emitter of which are respectively connected to two ends of said control voltage generating capacitor, and a resistor connected between a base of said transistor and an output end of said voltage comparator.

8. A multiplier according to claim 1, wherein said voltage-to-current converter comprises a thirteenth transistor, having a collector connected to said current source circuit, an emitter connected to said second power source line through a resistor, and a base connected to one of the sides of said control voltage generating capacitor.

9. A multiplier according to claim 1, wherein said multiwindow comparator provides a plurality of inverting voltages which hold predetermined relationships with each other.

10. A multiplier according to claim 9, wherein said multiwindow comparator comprises a multi-emitter transistor; voltage division circuits each having resistors which correspond to respective emitters of said multi-emitter transistor so as to provide different voltage division ratios, respectively; and a plurality of transistors having bases respectively connected to voltage division points of a different one of said voltage division circuits and emitters commonly connected to each other, the collectors of selected transistors among said plurality of transistors each being respectively connected to the base of another of said plurality of transistors whose voltage division circuit connected to its base has a smaller voltage division ratio than the voltage division circuit of the transistor being connected, the plurality of pulse signals being producted from the collector of said plurality of transistors whose base is connected to the voltage division circuit which has the smallest of the voltage division ratios.

11. A multiplier according to claim 9, wherein said multiwindow comparator comprises a plurality of voltage comparators, each having one input which receives a reference voltage having a voltage level different from the voltage levels of the other input reference voltages, and another input which receives the triangular wave voltage from said triangular wave generating capacitor; and a plurality of transistors, having bases respectively connected through resistors to the output of a different one of said voltage comparators and emitters which are commonly connected to said second power source line, the collectors of selected transistors among said plurality of transistors each being respectively connected to the base of another of said plurality of transistors which is associated with a voltage comparator whose one input receives a lower reference voltage than the comparator associated with the transistor being connected, the plurality of pulse signals being produced from the collector of said transistor among said plurality of transistors which is connected to the voltage comparator which receives the lowest reference voltage.

* * * * *